United States Patent [19]

Chen

[11] Patent Number: 5,748,365
[45] Date of Patent: May 5, 1998

[54] CATADIOPTRIC ONE-TO-ONE TELECENTRIC IMAGE COMBINING SYSTEM

[75] Inventor: Chungte W. Chen, Irvine, Calif.

[73] Assignee: Hughes Electronics, Los Angeles, Calif.

[21] Appl. No.: 621,572

[22] Filed: Mar. 26, 1996

[51] Int. Cl.$^6$ ............................ G02B 17/00; G02B 21/00
[52] U.S. Cl. ............................................ 359/366; 359/727
[58] Field of Search ........................... 359/364, 365, 359/366, 629, 631, 634, 638, 727, 728, 729, 730, 731, 858, 859, 861

[56] References Cited

U.S. PATENT DOCUMENTS

| | | | |
|---|---|---|---|
| 4,711,535 | 12/1987 | Shafer | 359/731 |
| 4,743,112 | 5/1988 | Burke | 356/326 |
| 5,073,016 | 12/1991 | Burke | 359/727 |
| 5,559,629 | 9/1996 | Sheets et al. | 359/364 |

*Primary Examiner*—P. M. Dzierzynski
*Assistant Examiner*—Mark A. Robinson
*Attorney, Agent, or Firm*—Michael W. Sales; W. K. Denson-Low

[57] ABSTRACT

A catadioptric one-to-one optical relay system which is telecentric in both object and image space. The system includes three modules, which include a spherical primary mirror, a spherical secondary mirror with a zero power doublet for axial color correction, and an X-prism for spectral division. The chromatic aberration generated by the X-prism is compensated by the zero power doublet corrector. Because the system is telecentric in both object and image space, the coatings associated with the X-prism are simplified. The system can be used in telescopes, optical systems with sensor protection, and color CCD assemblies.

22 Claims, 5 Drawing Sheets

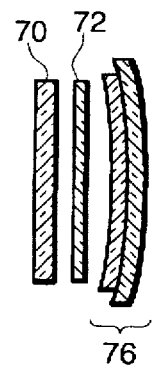
FIG. 2.
FIG. 3.
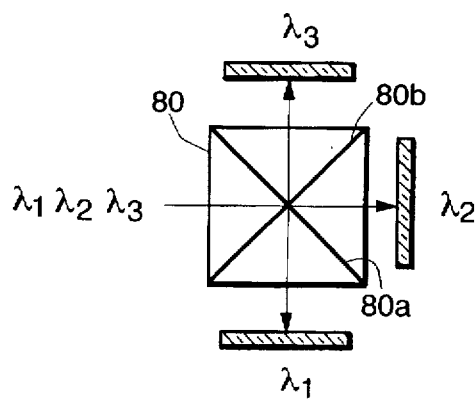
FIG. 4.
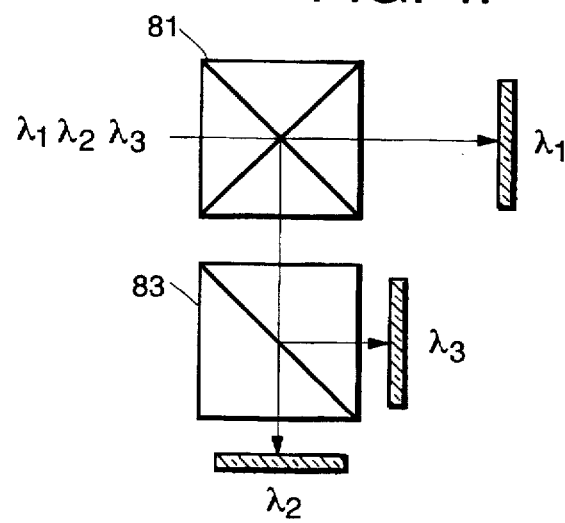
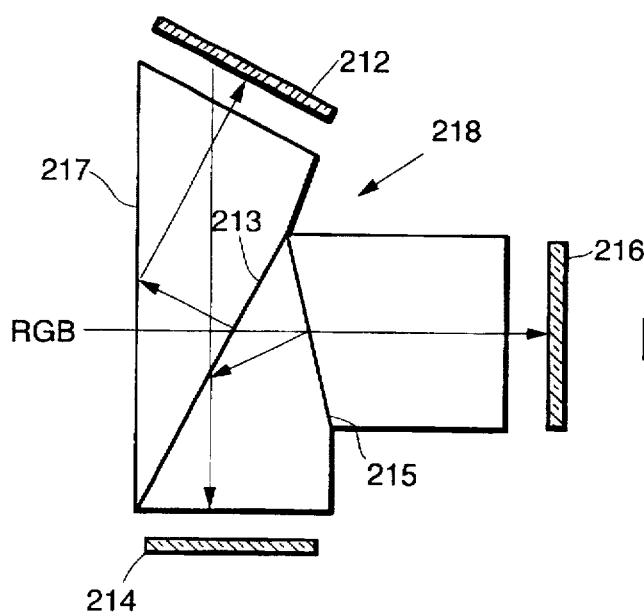
FIG. 8.

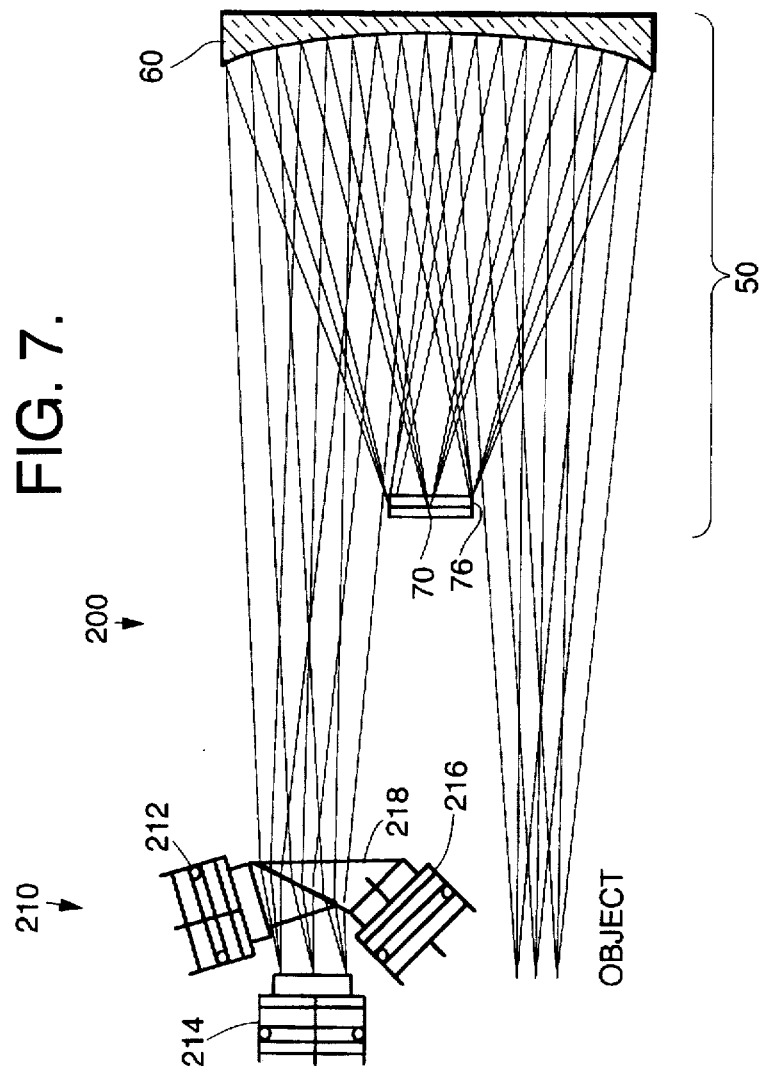

5,748,365

1

CATADIOPTRIC ONE-TO-ONE TELECENTRIC IMAGE COMBINING SYSTEM

TECHNICAL FIELD OF THE INVENTION

This invention relates to image combining systems, and more particularly to a system which is telecentric in both the object and image space.

BACKGROUND OF THE INVENTION

A conventional one-to-one refractive relay lens is symmetric with respect to the aperture stop located at the center of the lens. The limitations associated with this class of optical relay system include that the useful spectral band is limited, and the image quality is limited by such aberrations as field curvature, axial chromatic aberration and oblique spherical aberration. A further limitation is that the conventional one-to-one refractive relay lens is not telecentric at either end. When the principal ray of an optical system is parallel to the optical axis in the image space, this optical system is telecentric in the image space. Similarly, the optical system is telecentric in the object space when its principal ray is parallel to the optical axis in the object space. The telecentric condition is very critical to many optical systems with very stringent requirements in magnification, such as a photolithography system used in the semiconductor industry. A small focus error will not result in a magnification change. Since its principal ray is perpendicular to the image plane, a telecentric optical system in the image space has more uniform illumination. In many high quality, high brightness projection systems, a liquid crystal light valve image source is required to operate in the telecentric space for higher contrast ratio.

In many sensor applications, the telecentric condition is very critical due to the stringent requirement of a uniform coating efficiency across the field of view. Additionally, a one-to-one relay capable of a wide spectral bandwidth is crucial to many multiple spectral band sensor applications. Unfortunately, the conventional refractive one-to-one relay is limited in useful spectral bandwidth. Furthermore, a field lens is required to relay the pupil to the aperture stop of the refractive lens, aggravating the field curvature.

The performance of a typical one-to-one refractive relay lens is limited by the field curvature and chromatic aberration. Therefore, both the spectral band coverage and the usable field of view are not very wide. In addition, the conventional refractive relay system is very difficult to implement the telecentric condition. The refractive relay system is also complicated and expensive to construct.

U.S. Pat. No. 3,821,763 describes a one-to-one relay known as the Offner relay. Although this all-reflective one-to-one relay overcomes the foregoing disadvantages, adding refractive components such as X-prisms, beam splitters and windows in the system will introduce chromatic and spherical aberrations. This invention overcomes these limitations.

SUMMARY OF THE INVENTION

A catadioptric one-to-one optical relay system is described, and includes a spherical concave primary mirror, a convex secondary mirror, a zero power doublet for axial color correction, and an optical means for spectral division. These optical elements are arranged such that light from an object is first collimated by the primary mirror and passes through the doublet to reflect from the secondary mirror, the reflected light passing through the doublet again and directed onto the primary mirror again, the primary mirror refocusing the light to form a relayed image, the optical division means located in front of the relayed image to divide the relayed image into first, second and third spectral band images.

The doublet corrects for chromatic aberration generated by the optical division means, which may be an X-prism or separate dichroic beam splitters.

BRIEF DESCRIPTION OF THE DRAWING

These and other features and advantages of the present invention will become more apparent from the following detailed description of an exemplary embodiment thereof, as illustrated in the accompanying drawings, in which:

FIG. 2 is an exploded side view of the secondary mirror assembly comprising the system of FIG. 1.

FIG. 3 shows the X-prism of the system of FIG. 1 in further detail.

FIG. 4 is a schematic illustrating two dichroic beam splitters which can alternatively be employed instead of an X-prism in the system of FIG. 1.

FIG. 7 is a schematic optical diagram of a color CCD assembly with a one-to-one catadioptric relay system.

FIG. 8 is a schematic optical diagram of a K-prism comprising the assembly of FIG. 7

DETAILED DESCRIPTION OF THE PREFERRED EMBODIMENT

Figure 1:
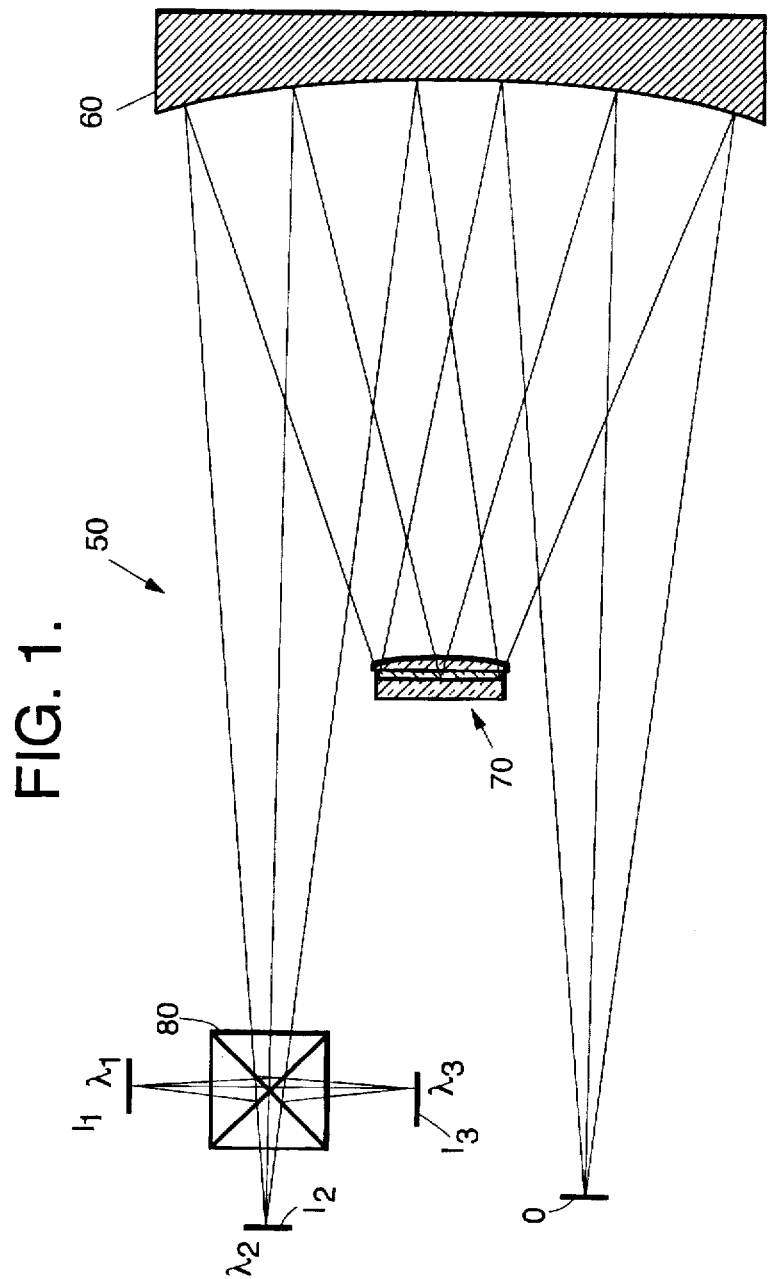
FIG. 1 is a schematic diagram of a preferred embodiment of a relay lens in accordance with the invention.

A catadioptric one-to-one relay lens 50 in accordance with the invention is illustrated in the schematic diagram of FIG. 1. The relay lens 50 includes three modules, a spherical primary mirror 60, an aspheric secondary mirror 70 with a zero power doublet 76 for axial color correction, and an X-prism 80 for spectral division. While the secondary mirror could alternatively be made as a spherical mirror, with an aspheric mirror, the spherical aberration of the system can be very well corrected. Therefore, the usable numerical aperture can be larger, the speed of the relay system can be faster and the usable field of view is larger.

The secondary mirror 70 is shown in the exploded side view of FIG. 2, and forms an aperture stop. An optical correction filter 72 is sandwiched between the mirror 70 and the zero-power doublet 76. This filter may, in an exemplary embodiment, be a transmissive liquid crystal device.

The zero power doublet 76 comprises one lens with high Abbe number (such as BK7, SK16) and one lens with low Abbe number (such F2, SF11). While maintaining zero total optical power or a very small optical power, various amounts of chromatic aberration can be generated by varying the optical power of each lens. For instance, the chromatic aberration of a SK16-F2 zero power doublet with 1.0 and −1.0 optical power for the SK16 and F2 lenses, respectively, is different from that of a 0.9 and −0.9 optical power of the SK16-F2 doublet. The doublet 76 is used to compensate for chromatic aberrations generated by the X-prism 80.

The system includes an aperture stop located at the secondary mirror 70. The aperture stop is either a mechanical or optical means to define the speed of the optical system; the larger the aperture, the more light the optical system collects. The aperture stop should be at or near the secondary mirror so that the one-to-one relay is symmetric with respect to the secondary mirror.

FIG. 3 shows the X-prism 80 in further detail. The X-prism 80 has two beam splitting surfaces 80A and 80B, coated with multiple layer band pass filter coatings. The surface 80A reflects the short wavelength band $\lambda_1$, and transmits the medium and long wavelength bands $\lambda_2$ and $\lambda_3$. Similarly, the surface 80B reflects the long wavelength band $\lambda_3$, and transmits the medium and short wavelength bands, $\lambda_2$ and $\lambda_1$, respectively. So, the radiation impinging on the X-prism is divided into three different spectral bands, and forwarded to the corresponding detection assemblies. The wavelength range of the bands can be either very wide or narrow. For instance, the overall spectral band can in one exemplary embodiment cover the visible spectra (0.45 $\mu$m–0.7 $\mu$m), a mid-range infrared (3.0 $\mu$m–5.0 $\mu$m) and long wavelength infrared (8.0 $\mu$m–12.0 $\mu$m). On the other hand, the overall spectral band in another exemplary embodiment can be the visible spectral band including the respective blue, green and red bands.

Alternatively, the X-prism can be replaced by two separate dichroic beam splitters, e.g. beam splitter cubes 81 and 83, shown in FIG. 4. The beam splitter 81 reflects both the medium wavelength $\lambda_2$ and the long wavelength $\lambda_3$, and transmits the short wavelength $\lambda_1$. The second beam splitter cube 83 reflects the long wavelength $\lambda_3$ and transmits the medium wavelength $X_2$.

The radiation from the object plane O (FIG. 1) is first collimated by the primary mirror 60, then passes through the doublet 76, reflects off the secondary mirror 70 (the last surface of the doublet), passes through the doublet again, and finally re-focussed by the same spherical primary mirror 60 to form a relayed image at respective image planes $I_1$, $I_2$ and $I_3$ (FIG. 1).

The X-prism 80 is located in front of the image to divide the relayed image into three spectral band images. The chromatic aberration generated by the X-prism 80 and any refractive materials associated with a detector assembly is compensated by the zero power doublet corrector. A detector assembly such as a CCD or infrared detector array can be employed with the system.

The one-to-one catadioptric relay lens 50 of FIG. 1 has several advantages. The lens is telecentric in both object and image space, simplifying the coatings associated with the X-prism and the detector assembly. The primary and secondary mirrors 60 and 70 are all spherical. Therefore, the fabrication cost is relatively inexpensive, the tolerances are looser, and the image quality is excellent. A further advantage is that the chromatic aberration correction is very good over a much wider spectral bandwidth than is possible with conventional relays.

Figure 5:
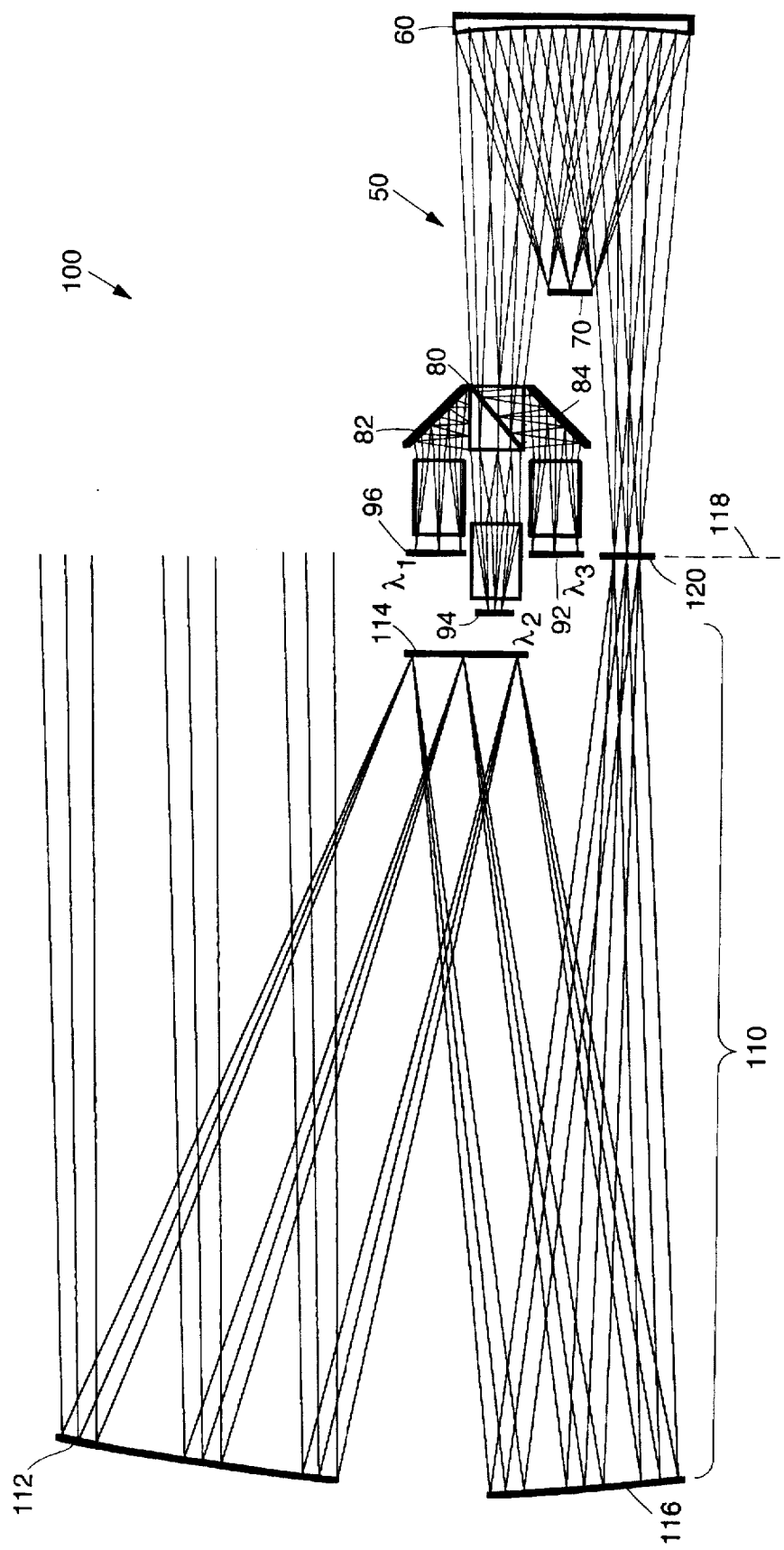
FIG. 5 is a schematic optical diagram of a telescope employing a one-to-one catadioptric relay system.

Among the possible applications for a relay lens 50 in accordance with the invention is a telescope with a one-to-one catadioptric relay. FIG. 5 is a schematic diagram of an optical system 100 comprising a three mirror telescope 110 and a one-to-one catadioptric relay system 50. The telescope 110 includes mirrors 112, 114, 116. A distant object is focused by the telescope 110 in the intermediate image plane 118, where a reticle 120 is typically located. The reticle and intermediate image are further relayed by the catadioptric one-to-one relay system 50. As in FIG. 1, the system 50 includes a spherical primary mirror 60, a spherical secondary mirror 70 with doublet 76, and an X-prism. Different spectral bands of the image are finally spatially separated by the X-prism 80 and reflected by mirrors 82, 84 on a detector assembly, which includes three different detector arrays 92, 94 and 96 for three different spectral bands. For image processing applications, a filter can be placed in the intermediate image plane for either image enhancement or correlation. The filter can be either in the intermediate image plane such as the location of the reticle in FIG. 5, or a filter 72 in the pupil plane such as the location of the secondary mirror of the one-to-one relay, as shown in FIG. 2. Indeed, the reticle is a filter to provide the boresight reference. When the filter is in the pupil position, between the secondary and the doublet corrector of the one-to-one relay, i.e. as shown as filter 72 in FIG. 2, it can perform optical correction functions similar to the Vander Lugt filter, described, e.g., in *Introduction to Fourier Optics*, J. W. Goodman, Chapter 7, McGraw-Hill Book Company, 1964. The advantages of using the one-to-one relay of this invention to perform the optical correction are that the relay is capable of very wide spectral band correction, very good aberration correction, and it is telecentric in both the object and pupil space.

Figure 6:
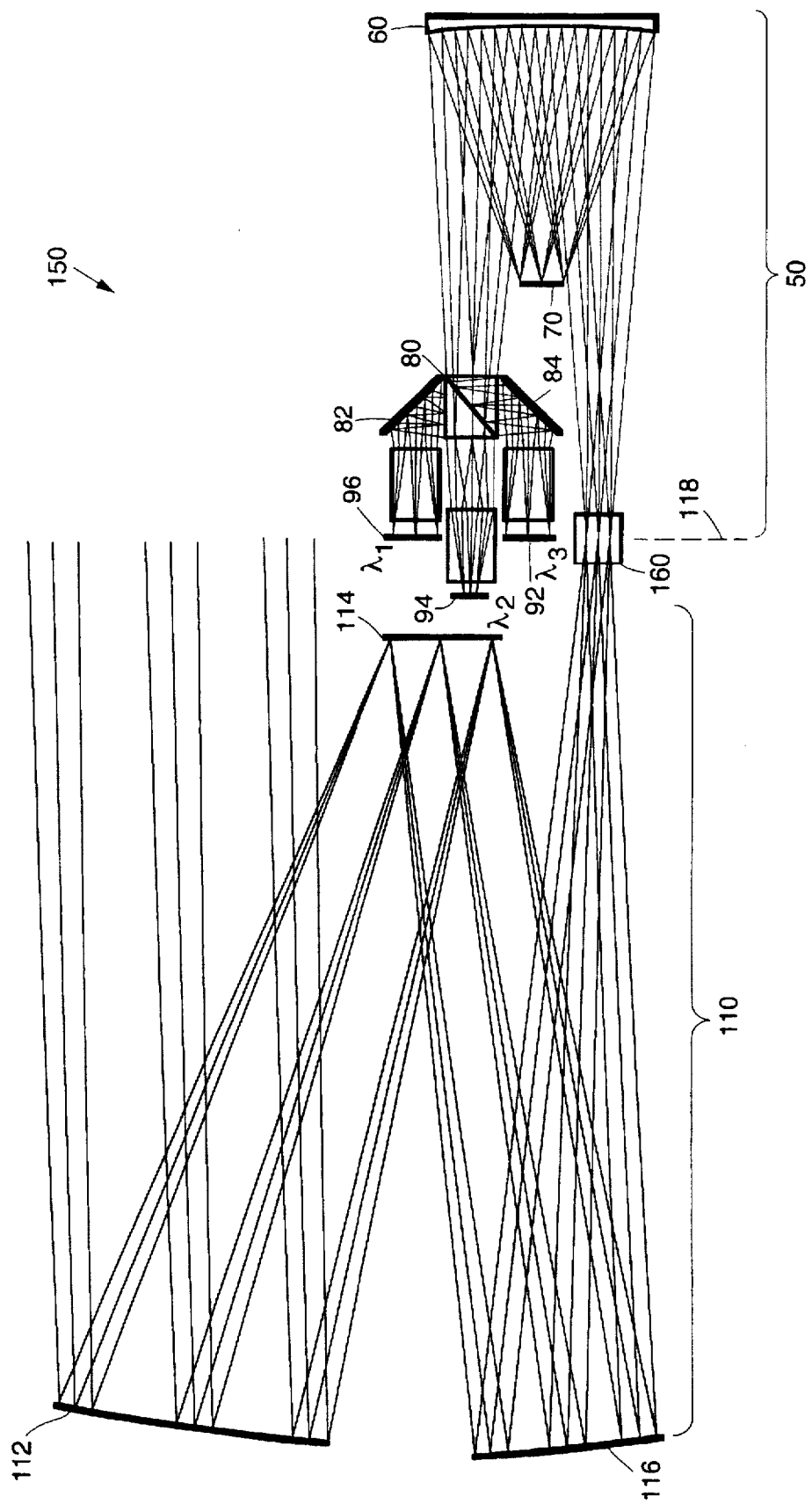
FIG. 6 is a schematic optical diagram of a sensor protection system with a one-to-one catadioptric relay system.

Another application for a relay embodying the invention is an optical system 150 with a sensor protection assembly 160, as shown in FIG. 6. Sensor protection is a key requirement for many advanced sensors. Many sensor protection devices are liquid cells or block E–O devices. One of the main threats to a sensor is to be illuminated with high power coherent radiation. When a high power laser aims at a sensor, the detector will be damaged by the tremendous power density focused by the sensor optics. One way to protect a sensor is to add a sensor protection device at the first fore optics image plane, and a relay optical system further relays the image onto the detector. When a high energy laser beam is aimed at the sensor, the liquid in the protection cell, such as ethanol, will be vaporized instantaneously. The cell will turn opaque and absorb the incoming laser beam energy. The chromatic aberration generated by these devices 160 is typically compensated by a refractive relay, and therefore the spectral bandwidth of the system is limited by the relay lens, which is generally narrow due to the secondary chromatic aberrations. The image quality is mainly limited by field curvature and secondary chromatic aberration. Additionally, the use of special glass materials to minimize the secondary color adds a significant cost to the system. The drawbacks associated with a refractive relay lens for sensor protection can be overcome by a catadioptric refractive relay.

As shown in FIG. 6, the system 150 includes a three mirror telescope 110 comprising mirrors 112, 114 and 116. To implement the sensor protection cell, the sensor intermediate image requires good image quality in order to maximize the power density of the incoming radiation to ignite the cell. Therefore, the aberration of the fore optics and the relay optics needs to be independently corrected. The telescope focusses the intermediate image at image plane 118, where the sensor protection assembly 160 is located. The image is passed through the assembly 160 to the relay assembly 50, which relays the image to the X-prism 80, which separates the different spectral bands of the image and through mirrors 82, 84 these different spectral bands are focused on a detector assembly, which includes three different detector arrays 92, 94 and 96 for three different spectral bands.

Another application for the relay of this invention is in a color CCD assembly 200 as illustrated in FIG. 7. Most of the advanced high resolution CCD arrays have three CCD chips 212, 214 and 216 butted together with a prism assembly 218. Compared with older generation color CCDs consisting of three sub-pixel (blue, red and green) for each pixel, the new color CCD assembly has much smaller pixel size. Therefore, the system resolution can be increased and the system package size can often be reduced. Unfortunately, the prism assembly 218 generates some chromatic and third-order aberrations. Consequently, the color CCD assembly is not a self-corrected module. This makes system integration much more complicated. In addition, many optical systems do not have enough back focal distance to accommodate the prism assembly. By combining a color CCD assembly 210 with a catadioptric one-to-one relay system 50, as shown in FIG. 4, these drawbacks can be overcome. The relay system 50 includes the spherical primary mirror 60, the spherical secondary mirror 70, and the doublet 76, which focuses the object directly onto the prism assembly 218. Thus, the relay 50 does not include the X-prism, whose spectral separating function is performed by the prism assembly 218 in this embodiment. The operation of the one-to-one relay optical system of FIG. 7 is basically identical to that of FIG. 1, except a K-prism 218, shown in FIG. 8, replaces the X-prism 80. Therefore, an RGB object is spectrally separated and relayed onto the CCD assembly 210 through the K-prism.

The principles of K-prism operation for spectral separation is shown in FIG. 8, where the blue radiation B of the incoming RGB radiation is reflected from the beam splitting surfaces 213 and 217 and focused on the CCD 212. After transmission through the beam splitting surface 213, the green radiation of the RG is reflected by the beam splitting surfaces 215 and 213 before focusing onto the green CCD 214. After transmission through the beam splitting surface 215, the red radiation is focused on the red CCD 216.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A catadioptric one-to-one optical relay system, comprising:

a spherical concave primary mirror;

a convex secondary mirror;

a zero power doublet for axial color correction; and an optical means for spectral division;

wherein said primary mirror, said secondary mirror, said doublet and said spectral division means are arranged such that light from an object is first collimated by the primary mirror and passes through the doublet to reflect from the secondary mirror, the reflected light passing through the doublet again and directed onto the primary mirror again, the primary mirror refocusing the light to form a relayed image, the optical division means located in front of the relayed image to divide the relayed image into first, second and third spectral band images.

2. The relay system of claim 1 wherein said doublet corrects for chromatic aberration generated by the optical division means.

3. The relay system of claim 2 wherein said doublet comprises a first lens fabricated of a first glass material, and a second lens fabricated of a second glass material which is different in Abbe number from the first glass material.

4. The relay system of claim 1 wherein said doublet corrects the chromatic aberration generated by any refractive material comprising the relay system.

5. The relay system of claim 1 wherein said secondary mirror and said zero power doublet form an optical assembly, wherein the secondary mirror is defined on a surface of said doublet.

6. The relay system of claim 1 further characterized by an aperture stop located at said secondary mirror.

7. The relay system of claim 1 wherein said optical division means reflects a short and a long spectral band, and transmits an intermediate spectral band.

8. The relay system of claim 1 wherein the secondary mirror is aspheric for correction of residual spherical aberration.

9. The relay system of claim 1 wherein the optical division means is an X-prism.

10. The relay system of claim 1 wherein the optical division means comprises first and second dichroic beam splitters.

11. The relay system of claim 1 further characterized in that the system is telecentric in both object and image space.

12. The relay system of claim 1 further comprising an optical filter located between said secondary mirror and said zero power doublet.

13. The relay system of claim 12 wherein said optical filter is a transmissive liquid crystal device.

14. A telescope having a one-to-one relay system, comprising:

a plurality of telescope mirrors arranged to focus a distant object at an intermediate image plane;

a catadioptric one-to-one relay system for further relaying the intermediate plane image and separating the image into a plurality of spectral component images, the relay system including:

a spherical concave primary mirror;

a convex secondary mirror with a zero power doublet for axial color correction coupled to the secondary mirror;

optical means for spectral division;

wherein the intermediate image light is first collimated by the primary mirror and passes through the doublet to reflect from the secondary mirror, the reflected image light passing through the doublet again and directed onto the primary mirror again, the primary mirror refocusing the light to form a relayed image, the spectral division means located in front of the relayed image to divide the relayed image into first, second and third spectral band images; and a detector assembly comprising first, second and third detector arrays responsive respectively to said first, second and third spectral band images.

15. The telescope of claim 14 wherein said doublet corrects for chromatic aberration generated by the optical division means.

16. The telescope of claim 14 further characterized in that the system is telecentric in both object and image space.

17. The telescope of claim 14 further comprising a reticle located at said intermediate image plane, and wherein said relay system relays both said intermediate image and said reticle.

18. The telescope of claim 14 further comprising a sensor protection device located at an intermediate image plane of the telescope.

19. The telescope of claim 14 further comprising an optical filter located between said secondary mirror and said zero power doublet.

20. The telescope of claim 19 wherein said optical filter is a transmissive liquid crystal device.

21. A self-corrected color charge-coupled-device (CCD) module, comprising:

a plurality of CCD chips butted together with a prism assembly to form a color CCD array; and a catadioptric one-to-one optical relay system, comprising:
- a spherical concave primary mirror;
- a convex secondary mirror; and
- a zero power doublet for axial color correction to correct for chromatic aberration introduced by said prism assembly;

wherein said primary mirror, said secondary mirror and said doublet are arranged such that light from an object is first collimated by the primary mirror and passes through the doublet to reflect from the secondary mirror, the reflected light passing through the doublet again and directed onto the primary mirror again, the primary mirror refocusing the light to form a relayed image, the prism assembly located in front of the relayed image to divide the relayed image into a plurality of spectral band images.

22. The relay system of claim 21 further characterized in that the relay system is telecentric in both object and image space.

* * * * *